US010204847B2

(12) United States Patent
Cho

(10) Patent No.: US 10,204,847 B2
(45) Date of Patent: Feb. 12, 2019

(54) MULTI-PHASE COMMON CONTACT PACKAGE

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/287,328

(22) Filed: Oct. 6, 2016

(65) Prior Publication Data
US 2018/0102306 A1    Apr. 12, 2018

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/565* (2013.01); *H01L 22/20* (2013.01); *H01L 23/3114* (2013.01); *H01L 23/4952* (2013.01); *H01L 23/49503* (2013.01); *H01L 23/49548* (2013.01); *H01L 23/49568* (2013.01); *H01L 23/49575* (2013.01); *H01L 24/13* (2013.01); *H01L 24/45* (2013.01);
(Continued)

(58) Field of Classification Search
CPC ... H01L 24/49; H01L 23/49562; H01L 25/16; H01L 23/49524; H01L 23/49575; H01L 24/39
USPC ......... 363/147; 257/107, 691, E23.052, 379, 257/531, 532, 676
See application file for complete search history.

(56) References Cited

U.S. PATENT DOCUMENTS 7,173,333 B2    2/2007 Hata et al.
7,449,778 B2   11/2008 Sander
(Continued)

FOREIGN PATENT DOCUMENTS

CN    102569361 A    7/2012
CN    102915987 A    2/2013
(Continued)

OTHER PUBLICATIONS

International Rectifier, "IRDM982 Series—IRDM982-025MB, IRDM982-035MB Complete Motion Controller Module for PM AC fan", Apr. 8, 2015, 27 pp.

*Primary Examiner* — Mouloucoulaye Inoussa
(74) *Attorney, Agent, or Firm* — Shumaker & Sieffert, P.A.

(57) ABSTRACT

In some examples, a device includes a first leadframe segment and a second leadframe segment, wherein the second leadframe segment is electrically isolated from the first leadframe segment. The device further includes at least four transistors comprising at least two high-side transistors electrically connected to the first leadframe segment and at least two low-side transistors electrically connected to the second leadframe segment. The device further includes at least two conductive output elements, wherein each conductive output element of the at least two conductive output elements is electrically connected to a respective high-side transistor of the at least two high-side transistors and a respective low-side transistor of the at least two low-side transistors. The device further includes an integrated circuit electrically connected to a control terminal of each transistor of the at least four transistors.

20 Claims, 15 Drawing Sheets

(51) Int. Cl.
*H01L 21/56* (2006.01)
*H01L 21/66* (2006.01)
*H01L 23/31* (2006.01)
*H01L 23/00* (2006.01)
*H02M 7/00* (2006.01)
*H02M 3/158* (2006.01)
*H02M 7/217* (2006.01)

(52) U.S. Cl.
CPC ... *H02M 7/003* (2013.01); *H01L 2224/13147* (2013.01); *H01L 2224/45014* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2924/181* (2013.01); *H02M 3/158* (2013.01); *H02M 7/2173* (2013.01)

(56) References Cited

U.S. PATENT DOCUMENTS

| 7,880,280 | B2 | 2/2011 | Otremba |
| 7,943,955 | B2 | 5/2011 | Haeberlen et al. |
| 8,138,585 | B2 | 3/2012 | Liu et al. |
| 8,488,316 | B2 | 7/2013 | Zeng et al. |
| 8,704,269 | B2 | 4/2014 | Macheiner et al. |
| 9,087,829 | B2 | 7/2015 | Macheiner et al. |
| 2007/0181908 | A1* | 8/2007 | Otremba .......... H01L 23/49575 257/107 |
| 2007/0252265 | A1 | 11/2007 | Sander |
| 2012/0014059 | A1 | 1/2012 | Zeng et al. |
| 2012/0041059 | A1 | 1/2012 | Zeng et al. |
| 2013/0032855 | A1 | 2/2013 | Macheiner et al. |
| 2015/0145112 | A1 | 5/2015 | Otremba |

FOREIGN PATENT DOCUMENTS

| DE | 102006020243 B3 | 1/2008 |
| DE | 102008006835 A1 | 9/2008 |
| DE | 102012213208 A1 | 2/2013 |
| DE | 102014117019 A1 | 5/2015 |
| DE | 102014203899 A1 | 9/2015 |
| WO | 2009154969 A2 | 12/2009 |

* cited by examiner

MULTI-PHASE COMMON CONTACT PACKAGE

TECHNICAL FIELD

This disclosure relates to semiconductor packaging, and more specifically, to semiconductor packages for power electronics.

BACKGROUND

A half-bridge circuit may include two analog devices or switches. Half-bridge circuits may be used in power supplies for motors, in rectifiers, and for power conversion. Each half-bridge circuit package has several contacts and may include several conductive paths to connect the contacts to each other and to external components.

Some circuits may combine two or more half-bridge circuits to create a multiphase power converter. The multi-phase power converter may have an output node for each phase of the circuit. Multiphase power converters may be used as direct-current-to-direct-current (DC/DC) converters or alternating-current-to-DC (AC/DC) converters in a variety of applications, such as electronics, automotive, and electric motors, among others.

SUMMARY

This disclosure describes techniques for a multiphase power converter including an integrated circuit (IC) electrically connected to the control terminal of each transistor of the multiphase power converter. The multiphase power converter may include common-contact leadframe segments and conductive elements to shorten the length of connections within the power converter package and reduce parasitics.

In some examples, a device includes a first leadframe segment and a second leadframe segment, wherein the second leadframe segment is electrically isolated from the first leadframe segment. The device further includes at least four transistors comprising at least two high-side transistors electrically connected to the first leadframe segment and at least two low-side transistors electrically connected to the second leadframe segment. The device further includes at least two conductive output elements, wherein each conductive output element of the at least two conductive output elements is electrically connected to a respective high-side transistor of the at least two high-side transistors and a respective low-side transistor of the at least two low-side transistors. The device further includes an IC electrically connected to a control terminal of each transistor of the at least four transistors.

In some examples, a method is described for constructing a power electronics device package. The method may include electrically connecting a first side of each high-side transistor of at least two high-side transistors of at least four transistors to a first leadframe segment. The method may further include electrically connecting a first side of each low-side transistor of at least two low-side transistors of the at least four transistors to a second leadframe segment, wherein the first leadframe segment is electrically isolated from the second leadframe segment. In addition, the method may further include electrically connecting each conductive output element of at least two conductive output elements to a second side of a respective high-side transistor of the at least two high-side transistors and a second side of a respective low-side transistor of the at least two low-side transistors. The method may also include electrically connecting an IC to a control terminal on a second side of each transistor of the at least four transistors.

In some examples, a multi-phase power device includes a first leadframe segment and a second leadframe segment, wherein the second leadframe segment is electrically isolated from the first leadframe segment. The multi-phase power device further includes at least four vertical transistors comprising at least two high-side vertical transistors electrically connected to the first leadframe segment and at least two low-side vertical transistors electrically connected to the second leadframe segment, wherein the first leadframe segment and the second leadframe segment are electrically connected to a first side of the at least four vertical transistors. The multi-phase power device further includes at least two conductive output elements, wherein each conductive output element of the at least two conductive output elements is electrically connected to a second side of a respective high-side vertical transistor of the at least two high-side vertical transistors and a second side of a respective low-side vertical transistor of the at least two low-side vertical transistors. The multi-phase power device further includes at least four conductive control elements, wherein each conductive control element of the at least four conductive control elements is electrically connected to a control terminal on the second side of each respective transistor of the at least four transistors. The multi-phase power device further includes an integrated circuit (IC) electrically connected, by a respective conductive control element of the at least four conductive control elements, to each respective conductive control terminal of the at least four conductive control terminals.

The details of one or more examples are set forth in the accompanying drawings and the description below. Other features, objects, and advantages will be apparent from the description and drawings, and from the claims.

DETAILED DESCRIPTION

Figure 1:
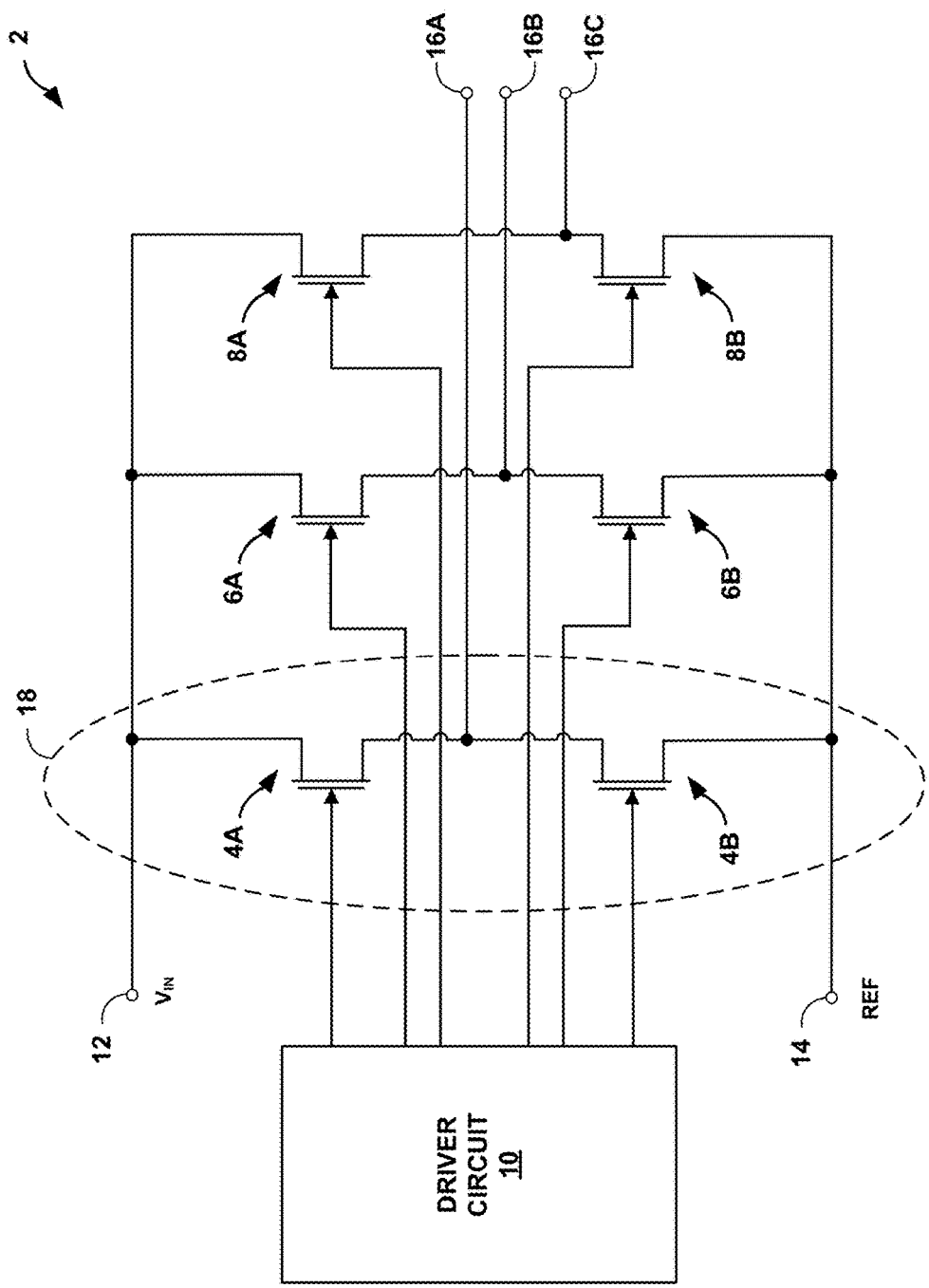
FIG. 1 is a circuit diagram of a multi-phase power converter, in accordance with some examples of this disclosure.

FIG. 1 is a circuit diagram of a multi-phase power converter, in accordance with some examples of this disclosure. In some examples, device 2 may include a multi-phase power converter such as a half-bridge direct-current-to-direct-current (DC/DC) buck converter for converting an input DC signal to an output DC signal with a lower voltage. For each phase, a multi-phase power converter may include a half-bridge circuit. As a DC-to-DC buck converter, device 2 may operate as a voltage regulator in a variety of applications. In some examples, device 2 may be designed for high-power applications large amounts of current and high voltages. However, the techniques of this disclosure may apply to other circuits and configurations, such as other power converters, including multi-phase power converters and alternating-current-to-DC (AC/DC) power converters.

Device 2 may include transistors 4A, 4B, 6A, 6B, 8A, 8B and driver circuit 10. In some examples, device 2 may contain more or fewer components than depicted in FIG. 1. Device 2 may include input node 12, reference node 14, and output nodes 16A-16C, as well as other nodes not shown in FIG. 1. Nodes 12, 14, and 16A-16C may be configured to connect to external components. For example, input node 12 may connect to an input voltage such as a power supply, reference node 14 may connect to a reference voltage, such as reference ground, and output nodes 16A-16C may connect to a load such as an electronic device. Input node 12 and reference node 14 may each include a leadframe segment and may be electrically isolated from each other. Each of output nodes 16A-16C may include a conductive output element, and each of output nodes 16A-16C may supply one phase of an output voltage to another device or circuit. In some examples, device 2 may operate as a multiphase motor driver, where each of output nodes 16A-16C is electrically connected to a field winding of an electric motor.

In some examples, electrical isolation may mean zero electrical current or a very high-ohm connection between two or more components. In some examples, even though two components are designed to be electrically isolated, there may be leakage current, electron tunneling, or other means for electrical current to flow at very low rates. In addition, two electrically isolated components may include capacitance between the two components.

Transistors 4A, 4B, 6A, 6B, 8A, 8B may include metal-oxide semiconductor (MOS) field-effect transistors (FETs), bipolar junction transistors (BJTs), and/or insulated-gate bipolar transistors (IGBTs). Transistors 4A, 4B, 6A, 6B, 8A, 8B may include n-type transistors or p-type transistors. In some examples, transistors 4A, 4B, 6A, 6B, 8A, 8B may include other analog devices such as diodes. Transistors 4A, 4B, 6A, 6B, 8A, 8B may also include freewheeling diodes connected in parallel with transistors to prevent reverse breakdown of transistors 4A, 4B, 6A, 6B, 8A, 8B. In some examples, transistors 4A, 4B, 6A, 6B, 8A, 8B may operate as switches, as analog devices, and/or power transistors.

Although transistors 4A, 4B, 6A, 6B, 8A, 8B are shown in FIG. 1 as MOSFET symbols, it is contemplated that any electrical device that is controlled by a voltage may be used in place of the MOSFETs as shown. For example, transistors 4A, 4B, 6A, 6B, 8A, 8B may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Transistors 4A, 4B, 6A, 6B, 8A, 8B may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. Improvements in magnetics and faster switching, such as Gallium Nitride (GaN) switches, may support higher frequency converters. These higher frequency circuits may require control signals to be sent with more precise timing than for lower frequency circuits.

Driver circuit 10 may be electrically connected to the control terminals of transistors 4A, 4B, 6A, 6B, 8A, 8B. Driver circuit 10 may include a controller and/or processor that may cause transistors 4A, 4B, 6A, 6B, 8A, 8B to conduct electricity. In some examples, driver circuit 10 may also include a pulse-width modulation (PWM) controller for varying and delivering PWM signals to the control terminals of transistors 4A, 4B, 6A, 6B, 8A, 8B. Together, transistors 4A, 4B, 6A, 6B, 8A, 8B and driver circuit 10 may include one or more semiconductor package such as a semiconductor die, chip-embedded substrate, an integrated circuit (IC), or any other suitable package. In some examples, driver circuit 10 may be integrated into the package with one or more of transistors 4A, 4B, 6A, 6B, 8A, 8B, or driver circuit 10 may be a separate IC. In some examples, driver circuit 10 may also connect to an external circuit or power supply through a node (not shown in FIG. 1).

Half-bridge circuit 18 may include transistors 4A, 4B. Transistors 4A, 4B may be coupled to each other and to output node 16A. Half-bridge circuit 18 may produce one phase of an output voltage for device 2. Transistors 6A, 6B and transistor 8A, 8B may each produce other phases of the output voltage for device 2. Device 2 may include three phases in the example depicted in FIG. 1. In some examples, device 2 may include two or more phases, where each phase includes a half-bridge circuit, such as half-bridge circuit 18, including two or more transistors.

In accordance with the techniques of this disclosure, device 2 may include a single package for transistors 4A, 4B, 6A, 6B, 8A, 8B and driver circuit 10. By including transistors 4A, 4B, 6A, 6B, 8A, 8B and driver circuit 10 in a single package, there may be fewer and shorter connections between the components of device 2 relative to conventional devices. In some examples, reducing the quantity and length of connections may reduce the effect of parasitic capacitances and parasitic inductances on the performance of device 2. A single package for all of the components of device 2 may also save space and cost, as compared to separate packages or external components for device 2.

Figure 2:
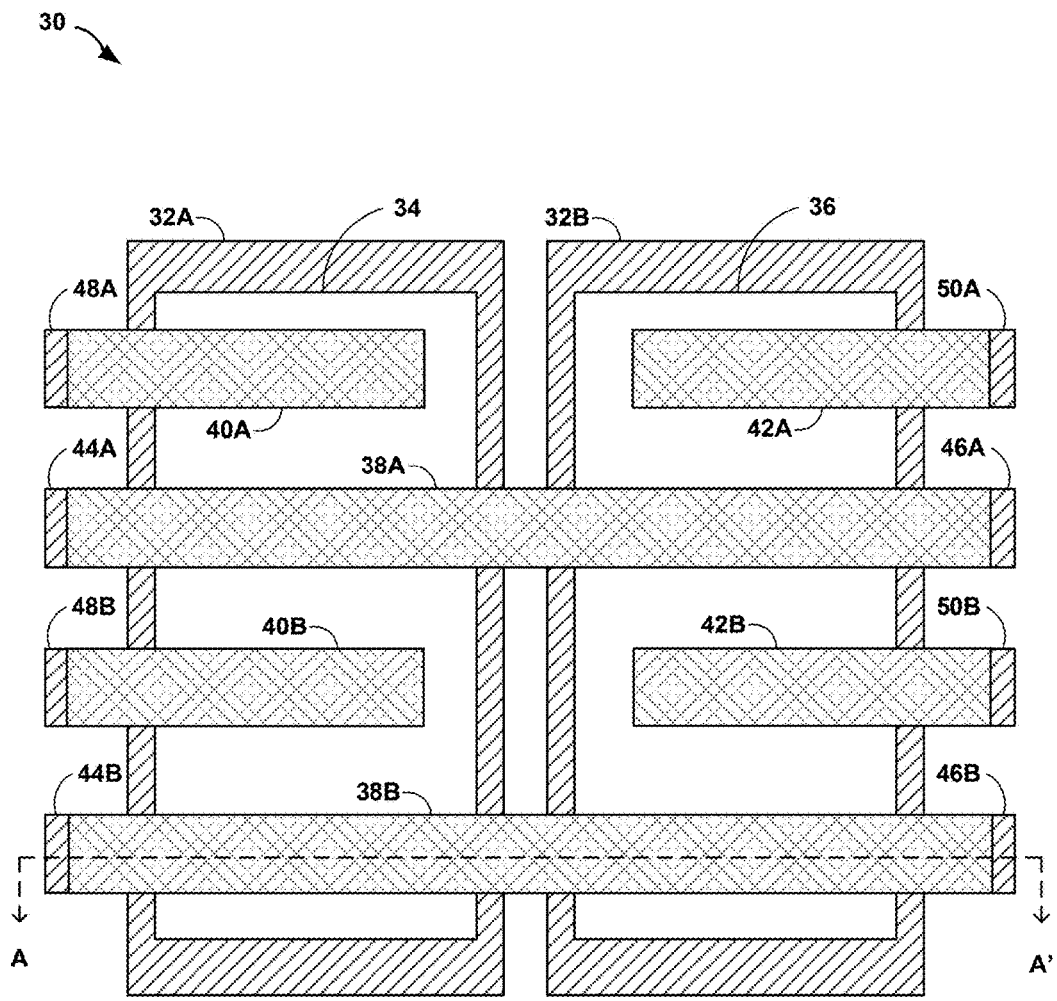
FIG. 2 is a top-view diagram of a two-phase device, in accordance with some examples of this disclosure.

FIG. 2 is a top-view diagram of a two-phase device 30, in accordance with some examples of this disclosure. Device 30 may include semiconductor die 34, 36 electrically connected to leadframe segments 32A, 32B. Semiconductor die 34 may include two high-side transistors, and semiconductor die 36 may include two low-side transistors. Leadframe segments 32A, 32B may include die paddles, metal layers, and/or any other suitable conductive material. Leadframe segment 32A may be electrically connected to a drain terminal of each high-side transistor in semiconductor die 34. Leadframe segment 32A may operate in a similar manner to input node 12 in FIG. 1. Leadframe segment 32B may be electrically connected to a source terminal of each low-side transistor in semiconductor die 36. Leadframe segment 32B may operate in a similar manner to reference node 14 in FIG. 1. Leadframe segments 32A, 32B may be referred to as "common contacts" because each of leadframe segments 32A, 32B may electrically connect to all of the transistors in semiconductor die 34 or semiconductor die 36. Conductive output elements 38A, 38B may be referred to as "common contacts" because each of conductive output elements 38A, 38B may electrically connect to all transistors in phase of two-phase device 30.

In some examples, the transistors in semiconductor die 34, 36 may be transistors that are integrated into a single piece of semiconductor material. Each of conductive output elements 38A, 38B may be electrically connected to a source terminal of a respective high-side transistor in semiconductor die 34 and a drain terminal of a respective low-side transistor in semiconductor die 36. Each of conductive output elements 38A, 38B may operate as a switch node element and/or as an output element for a phase of device 30. Conductive output element 38A may be electrically isolated from of conductive output element 38B, so that device 30 may produce two separate output phases.

The transistors in semiconductor die 34, 36 may include two load terminals, such as a source terminal and a drain terminal for a MOSFET or an emitter terminal and a collector terminal for a BJT and an IGBT. Each transistor in semiconductor die 34, 36 may include a control terminal such as a gate terminal for a MOSFET or a base terminal for a BJT and an IGBT. Each of the control terminals and load terminals of the transistors in semiconductor die 34, 36 may include a pad or area at a surface of the transistor to form external electrical connections. The high-side transistors in semiconductor die 34 may function in a manner similar to transistors 4A, 6A, 8A in FIG. 1, and the low-side transistors in semiconductor die 36 may function in a manner similar to transistors 4B, 6B, 8B in FIG. 1.

The transistors in semiconductor die 34, 36 may be configured such that the source terminal of a high-side transistor in semiconductor die 34 is electrically connected to a drain terminal of a low-side transistor in semiconductor die 36 by switching element 38B. Conductive output elements 38A, 38B, as well as the conductive output elements of FIGS. 3-11, may include a metallization layer, a clip, a ribbon, a die paddle, a wire bond, and/or any other suitable conductive material. In some examples, conductive output elements 38A, 38B may be electrically connected to an inductor (not shown in FIG. 2).

Each of conductive control elements 40A, 40B, 42A, 42B may be electrically connected to a control terminal of a respective transistor of device 30. Each of conductive output elements 38A, 38B may be electrically connected to two of switch leadframe segments 44A, 44B, 46A, 46B. Each of conductive control elements 40A, 40B, 42A, 42B may be electrically connected to one of control leadframe segments 48A, 48B, 50A, 50B. Conductive output elements 38A, 38B and conductive control elements 40A, 40B, 42A, 42B may be configured to electrically connect to external components on a first side of device 30, such as a top side. Switch leadframe segments 44A, 44B, 46A, 46B and control leadframe segments 48A, 48B, 50A, 50B may be configured to electrically connect to external components on a second side of device 30, such as a bottom side.

In some examples, device 30 may include a driver IC (not depicted in FIG. 2) that is electrically connected to the control terminal of each transistor of device 30 by conductive control elements 40A, 40B, 42A, 42B. The driver IC may deliver control signals to the control terminals of the transistors of device 30. The control signals may include pulse-width modulation (PWM) signals such as square waves. Using the control signals, the driver IC may cause a first transistor to conduct electricity while causing a second transistor not to conduct electricity, where the first transistor and second transistors are electrically connected to the same conductive output element of conductive output elements 38A, 38B. The driver IC may also be electrically connected to conductive output elements 38A, 38B so that the driver IC may detect the current and/or voltage at conductive output elements 38A, 38B.

Figure 3:
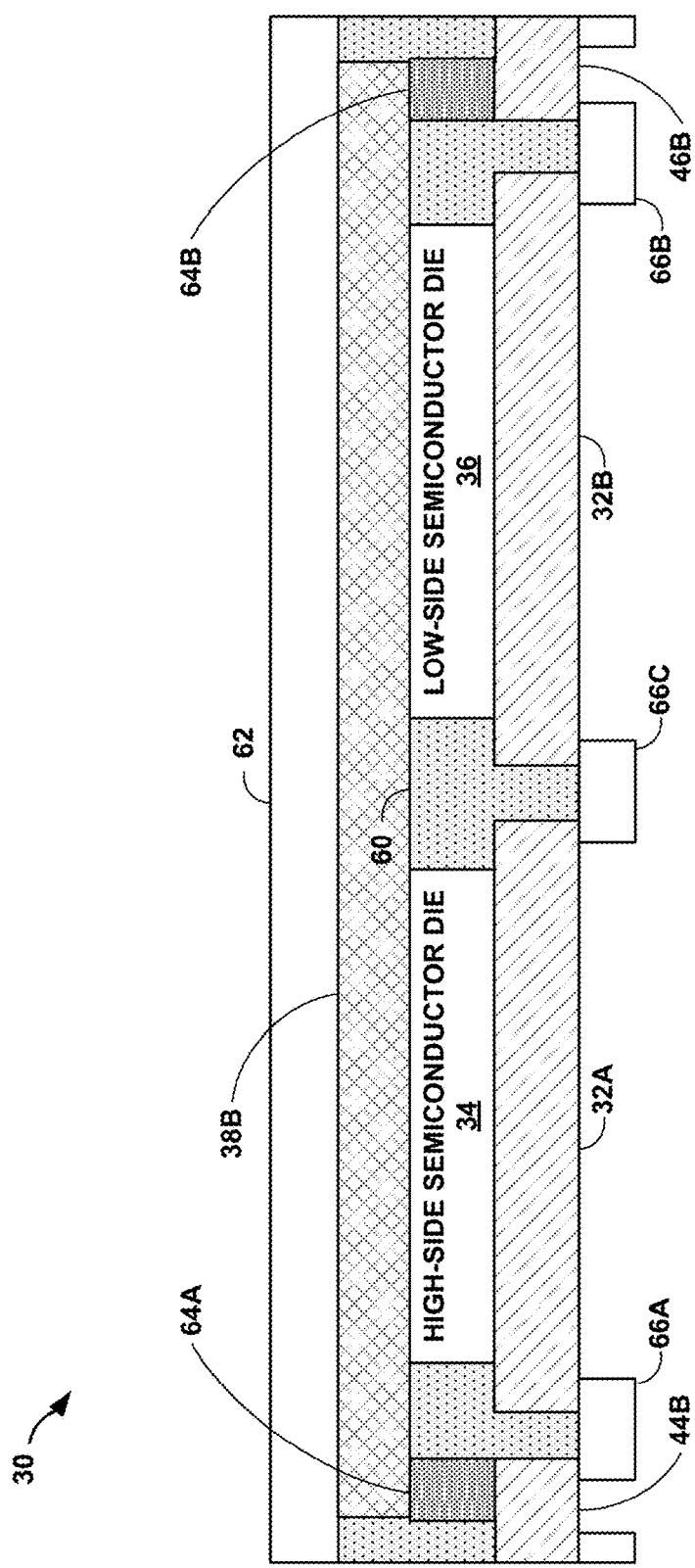
FIG. 3 is a side-view diagram of the two-phase device of FIG. 2, in accordance with some examples of this disclosure.

FIG. 3 is a side-view diagram of the two-phase device 30 of FIG. 2, in accordance with some examples of this disclosure. FIG. 3 may depict device 30 at cross section A-A' of FIG. 2. Leadframe segments 32A, 32B may be positioned on a first side, i.e., the bottom side, of semiconductor die 34, 36. Conductive output element 38A may be positioned on a second side, i.e., the top side, of semiconductor die 34, 36. Conductive control elements 40A, 40B, 42A, 42B (see FIG. 2) may also be positioned on the second side of semiconductor die 34, 36. The first side and the second side may be on opposite sides of semiconductor die 34, 36.

In some examples, as depicted in FIG. 3, device 30 may be at least partially encapsulated with molding compound 60. Molding compound 60 may hold the components of device 30 in place while allowing heat dissipation through leadframe segments 32A, 32B and conductive output element 38B. Molding compound 60 may include any suitable insulating material, such as laminate substrate, prepreg, resin-based dielectric material to cover semiconductor die 34, 36, or epoxy molding compound, which is a silica-reinforced or aluminum-reinforced epoxy laminate material often used to manufacture printed circuit boards (PCBs). Epoxy molding compound may have a melting point for its first melt that is less than two hundred degrees Celsius, which may be lower than other materials, such as FR-4. Epoxy molding compound may be pliable at lower temperatures before and during the first melt. Epoxy molding compound may have a higher melting temperature after the first melt, making it resilient to heat after the manufacturing process is finished.

In some examples, the deposition of molding compound 60 may be referred to as "over-molding." Device 30 may be referred to as a "chip-embedded substrate" because molding compound 60 encapsulates semiconductor die 34, 36. Molding compound 60 may be less viscous than molding compound 50 to allow molding compound 60 to flow into and fill the spaces around the components of device 30 and a driver IC (not shown in FIG. 3). The filler size or particle size in molding compound 60 may be small enough small enough to fit in the spaces between the components of device 30 and a driver IC. In some examples, molding compound 60 may include encapsulating material or epoxy molding compound. In some examples, the fabrication process may include liquid underfill or anisotropic tape with conductive film for the space between a driver IC and insulating element 62.

One or both of semiconductor die 34, 36 may include vertical transistors that are manufactured from silicon or any other suitable semiconductor. For a vertical transistor, the source terminal and the drain terminal may be on opposite sides or opposite surfaces of the transistor. Current in a vertical transistor may flow through the transistors from top to bottom or from bottom to top. For example, for a high-side transistor in semiconductor die 34, conventional current may flow from leadframe segment 32A to one of conductive output elements 38A-38C. For a low-side transistor in semiconductor die 36, conventional current may flow from one of conductive output elements 38A-38C to leadframe segment 32B. In some examples, device 30 may include lateral transistors or horizontal transistors that may offer certain benefits such as ease of fabrication and cost.

Leadframe segments 32A, 32B, 44B, 46B may include die paddles, metallization layers, and/or any other suitable conductive material. In some examples, device 30 may include embedded metal layers in addition to or instead of leadframe segments 32A, 32B, 44B, 46B, such as in a high frequency fusion device. The embedded layers may include copper and/or any other suitable conductive material. Conductive output element 38B may be electrically connected to switch leadframe segments 44B, 46B through conductive elements 64A, 64B. Conductive elements 64A, 64B may include vias, studs, pre-formed pillars, plated holes, or any other suitable conductive element. In some examples, conductive elements 64A, 64B may have a cross-section diameter of approximately one hundred micrometers to one hundred and fifty micrometers. In some examples, the cross-section diameter may be approximately two hundred and fifty micrometers for plated holes.

In some examples, the electrical connections between semiconductor die 34, 36 and conductive output element 38B and between semiconductor die 34, 36 and leadframe segments 32A, 32B may be formed by soldering. The electrical connections between conductive output element 38B and leadframe segments 32A, 32B may also be formed by soldering. Soldering components to form electrical connections may include placing solder between the components, applying heat to melt the solder, and allowing the solder to cool to form the electrical connection. The components of device 30 may also be glued or adhered together with conductive paste, conductive tape, conductive epoxy, and/or metal sintering. The connections between semiconductor die 34, 36, leadframe segments 32A, 32B, conductive output element 38B may include metalized plated laser vias, solder, and/or high-pressure/high-frequency metalized bonding such as diffusion bonding. Diffusion bonding may include direct bonding between semiconductor die 34, 36, each of which may be a semiconductor die, and leadframe segments 32A, 32B and conductive output element 38B.

Insulating element 62 may be positioned on a side of device 30 on which a driver IC is attached. In some examples, the driver IC may be electrically connected to conductive output elements 38A, 38B and/or conductive control elements 40A, 40B, 42A, 42B through or around insulating element 62. Insulating elements 66A-66C may be positioned on a side of device 30 that is mounted on a PCB. Insulating elements 66A-66C may create a gap between device 30 and the PCB for creating electrical and/or adhesive connections between device 30 and the PCB. In some examples, soldering may be used to create the electrical and/or adhesive connections between device 30 and the PCB. Insulating elements 66A-66C may include solder resist or solder mask that prevents soldering an electrical connection between leadframe segments 32A and 44B, between leadframe segments 32A and 32B, or between leadframe segments 32B and 46B.

Figure 4:
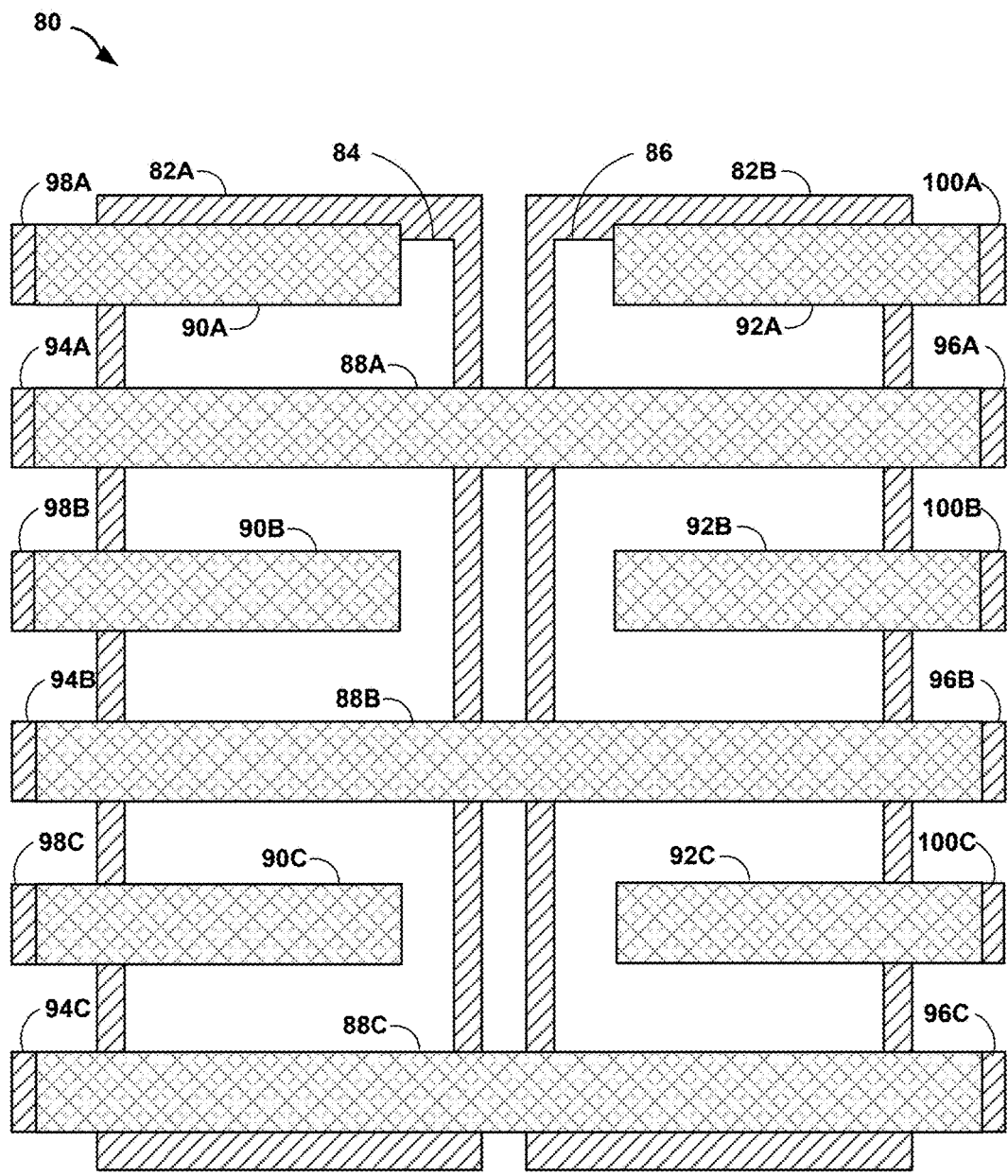
FIG. 4 is a top-view diagram of a three-phase device including integrated transistors, in accordance with some examples of this disclosure.

FIG. 4 is a top-view diagram of a three-phase device 80 including integrated transistors, in accordance with some examples of this disclosure. All of the high-side transistors of device 80 may be integrated into a single piece of semiconductor as semiconductor die 84, and all of the low-side transistors of device 80 may be integrated into a single piece of semiconductor as semiconductor die 86.

In some examples, device 80 may include a driver IC (not depicted in FIG. 4) that is electrically connected to the control terminal of each transistor of device 80 by conductive control elements 90A-90C, 92A-92C. The driver IC may deliver control signals to the control terminals to cause a first transistor to conduct electricity while causing a second transistor not to conduct electricity, where the first transistor and second transistors are electrically connected to the same conductive output element of conductive output elements 88A-88C.

Each of conductive output elements 88A-88C may be electrically connected to two of switch leadframe segments 94A-94C, 96A-96C. For each conductive output element, one switch leadframe segment may be larger than the other switch leadframe segment. The larger switch leadframe segment may be referred to as a "foot" of the conductive output element. In some examples, the foot portion of conductive output element 88A may be adjacent to semiconductor die 84, the foot portion of conductive output element 88B may be adjacent to semiconductor die 86, and the foot portion of conductive output element 88C may be adjacent to semiconductor die 84. By positioning the foot portions of conductive output elements 88A-88C on alternative sides of device 80, conductive output elements 88A-88C may be positioned closer together.

Certain shapes of conductive output elements 88A-88C, including the associated foot portions, may contribute to or prevent shifting of conductive output elements 88A-88C. Device 80 may function well when conductive output elements 88A-88C remain in place after manufacture and during operation. If conductive output elements 88A-88C are shaped like straight lines, conductive output elements 88A-88C may shift or move during installation or operation of device 80. By installing L-shaped conductive output elements 88A-88C with foot portions that fork into switch leadframe segments, conductive output elements 88A-88C may resist shifting during installation and operation of device 80.

Figure 5:
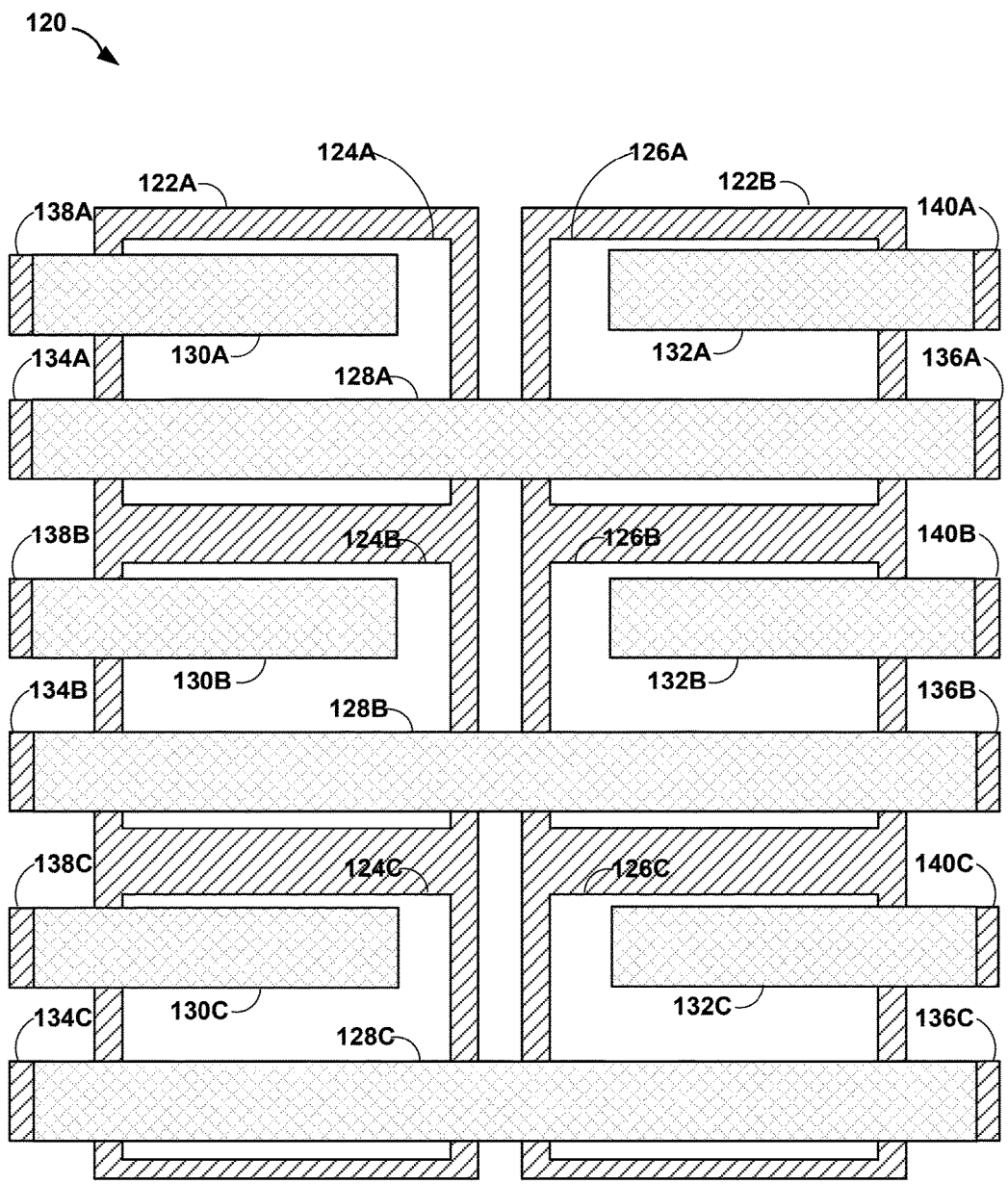
FIG. 5 is a top-view diagram of a three-phase device including discrete transistors, in accordance with some examples of this disclosure.

FIG. 5 is a top-view diagram of a three-phase device 120 including discrete transistors 124A-124C, 126A-126C, in accordance with some examples of this disclosure. Each of transistors 124A-124C, 126A-126C may be separate from other transistors of transistors 124A-124C, 126A-126C, i.e., not integrated with other transistors into a single semiconductor die. In some examples, each of transistors 124A-124C, 126A-126C may include a separate semiconductor die. In some examples, discrete transistors 124A-124C, 126A-126C may improve heat dissipation of device 120, as compared to integrated transistors. In some examples, if a discrete transistor is defective, the cost of discarding the semiconductor die with the defective transistor may be less, as compared to a defective integrated transistor inside a semiconductor die with at least one other transistor. If testing reveals a defective integrated transistor, the semiconductor die with two or more transistors may be discarded. In contrast, if testing reveals a defective discrete transistor, only the discrete transistor may be discarded.

Figure 6:
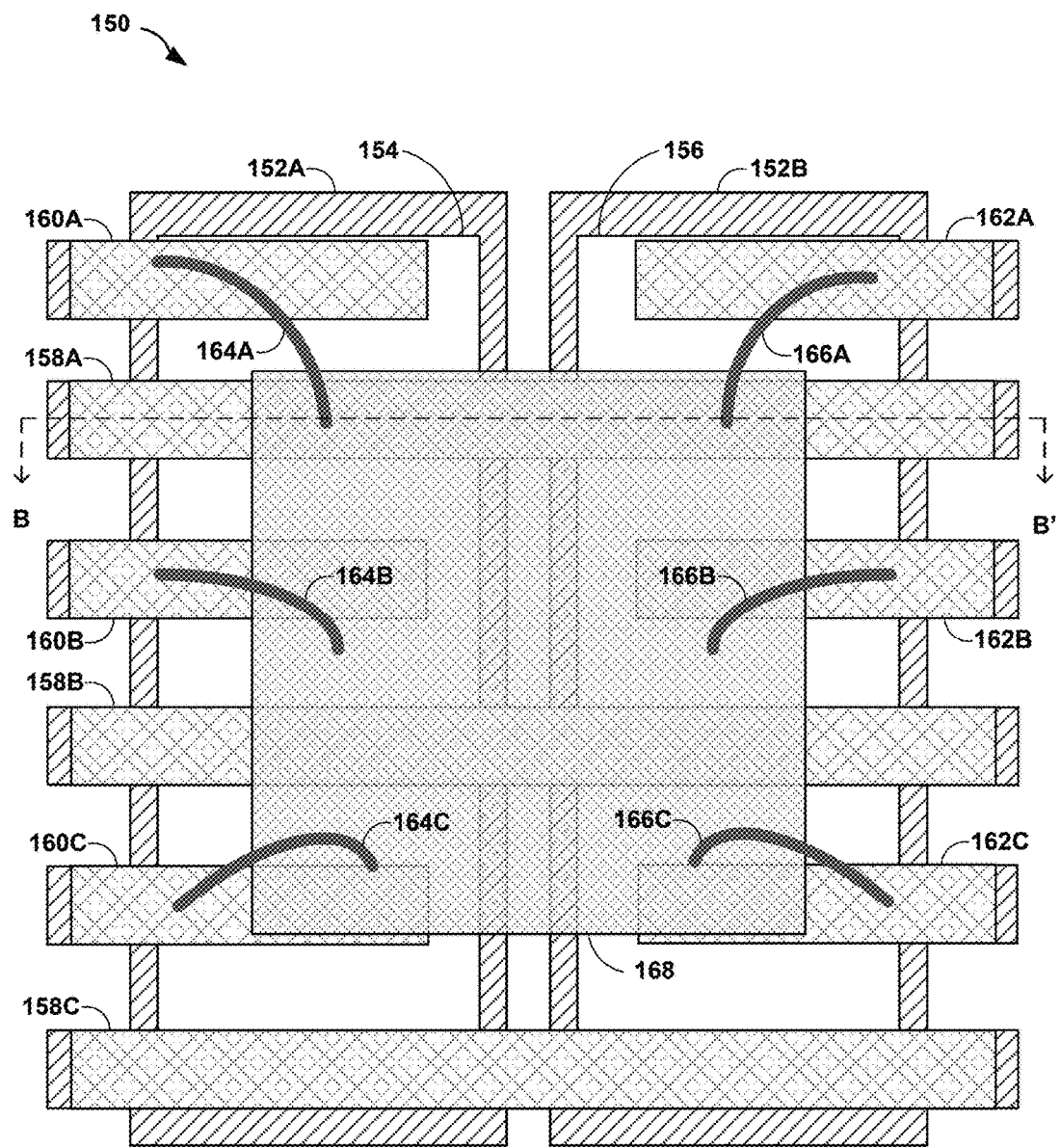
FIG. 6 is a top-view diagram of a three-phase device including an integrated circuit (IC) with wire-bonding technology, in accordance with some examples of this disclosure.

FIG. 6 is a top-view diagram of a three-phase device 150 including an integrated circuit (IC) 168 connected by wire-bonding technology, in accordance with some examples of this disclosure. IC 168 may be electrically connected to the control terminals of the transistors in semiconductor die 154, 156 by wire bonds 164A-164C, 166A-166C. In some examples, IC 168 may be electrically connected to conductive output elements 158A-158C by wire bonds not shown in FIG. 6. For example, wire bond 164A may electrically connect IC 168 to conductive control element 160A, which may be electrically connected to a control terminal of a high-side transistor in semiconductor die 154. In some examples, "conductive control element" may refer to conductive control element 160A and/or wire bond 164A.

Wire bonds 164A-164C, 166A-166C and wire bonds 164D, 166D (see FIG. 7) may include metal wires, such as copper wires or gold wires, an aluminum ribbon, a silver element, or any other suitable conductive material. In some examples, each of wire bonds 164A-164C, 166A-166C, 164D, 166D may have a length of approximately one or two millimeters.

Figure 7:
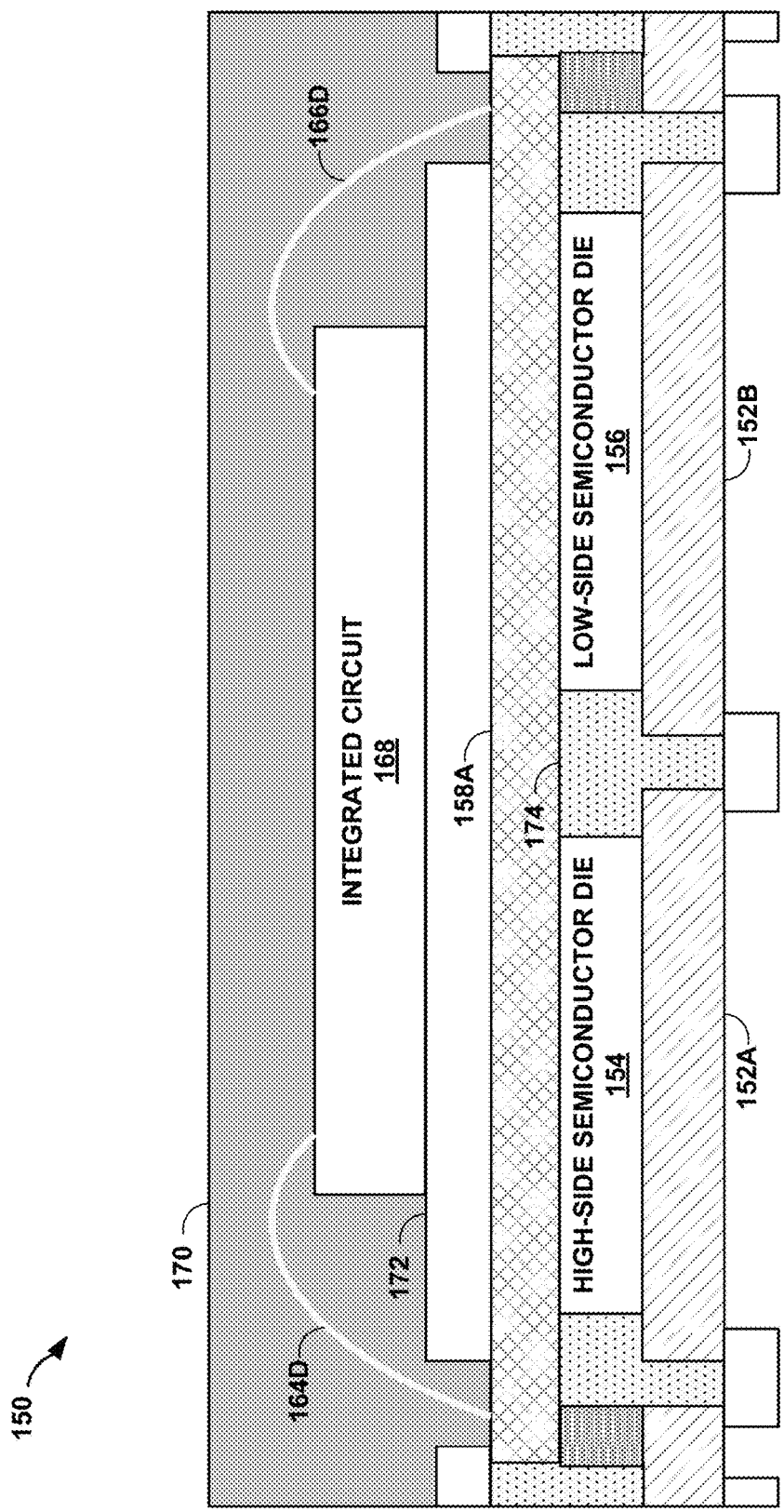
FIG. 7 is a side-view diagram of the three-phase device of FIG. 6 including an IC with wire-bonding technology, in accordance with some examples of this disclosure.

FIG. 7 is a side-view diagram of the three-phase device 150 of FIG. 6 including an IC 168 connected by wire-bonding technology, in accordance with some examples of this disclosure. FIG. 7 may depict device 150 at cross section B-B' of FIG. 6. IC 168 may be electrically connected to conductive output element 158A by wire bonds 164D, 166D. Wire bonds 164D, 166D may be an optional component in device 150 to allow IC 168 to electrically connect to conductive output element 158A. Wire bonds 164D, 166D may pass through or around insulating element 172.

Device 150 may comprise a leadless device, such as a power quad flat no-lead (PQFN) package, so that leadframe segments 152A, 152B may be mounted on a PCB. Leadframe segments 152A, 152B may be adhered to and electrically connected to the PCB by soldering or any other suitable method. IC 168 may be fully encapsulated in molding compound 170, or IC 168 may be partially encapsulated to allow for thermal dissipation and electrical connections to external components or power sources. Semiconductor die 154, 156 may be encapsulated in molding compound 174 to electrically isolate semiconductor die 154, 156 from components that are external to device 150.

Figure 8:
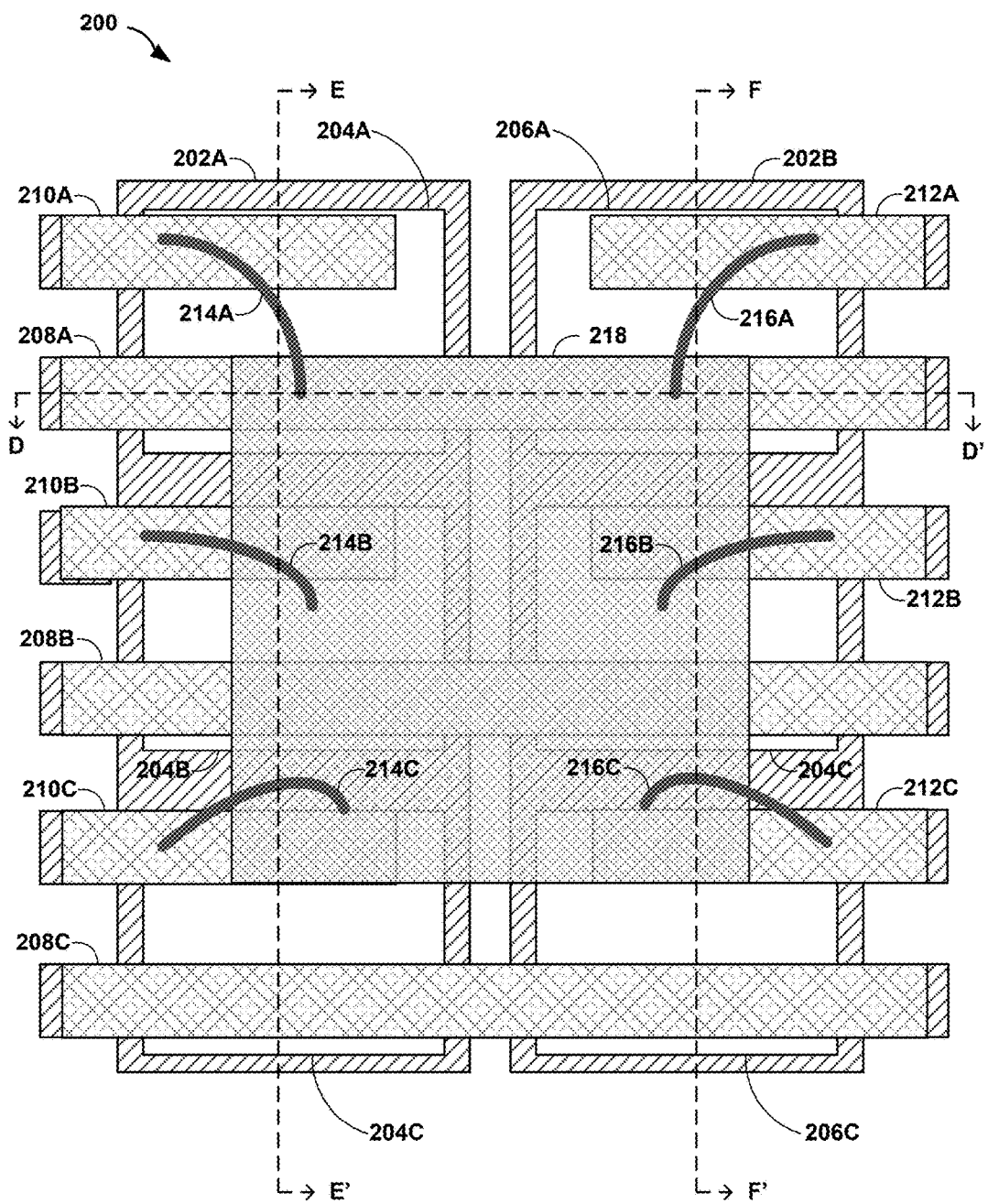
FIG. 8 is a top-view diagram of a three-phase device including discrete transistors and an IC with wire-bonding technology, in accordance with some examples of this disclosure.

FIG. 8 is a top-view diagram of a three-phase device 200 including discrete transistors 204A-204C, 206A-206C and an IC 218 connected by wire-bonding technology, in accordance with some examples of this disclosure. Each of transistors 204A-204C, 206A-206C may be separate from other transistors of transistors 204A-204C, 206A-206C, i.e., not integrated with other transistors into a single semiconductor die. In some examples, each of transistors 204A-204C, 206A-206C may include a separate semiconductor die. Discrete transistors 204A-204C, 206A-206C may offer benefits as described with respect to FIG. 5.

Figure 9:
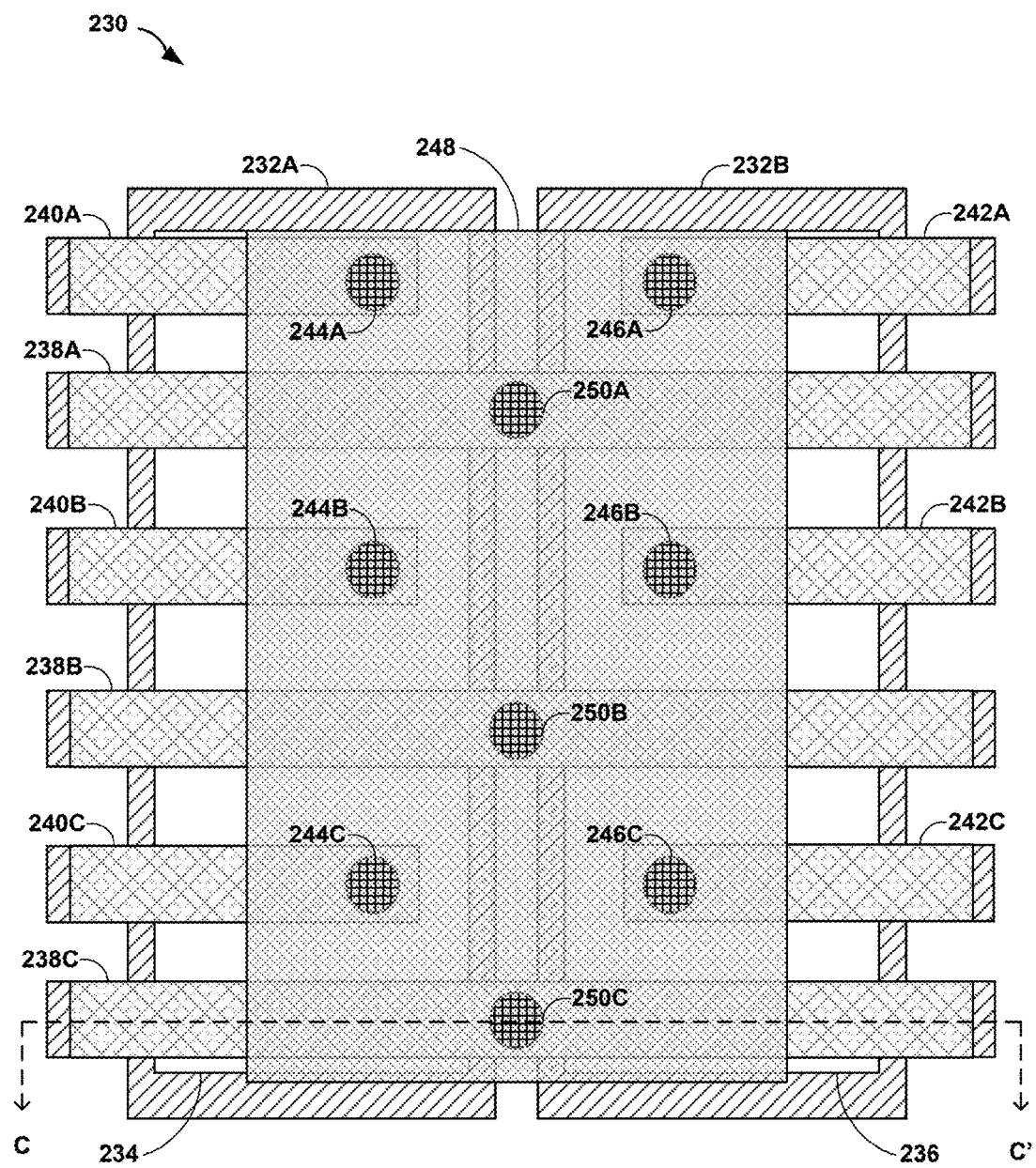
FIG. 9 is a top-view diagram of a three-phase device including an IC with flip-chip technology, in accordance with some examples of this disclosure.

FIG. 9 is a top-view diagram of a three-phase device 230 including an IC 248 connected by flip-chip technology, in accordance with some examples of this disclosure. IC 248 may be electrically connected to the control terminals of the transistors in semiconductor die 234, 236 by conductive bumps 244A-244C, 246A-246C. In some examples, IC 248 may be electrically connected to conductive output elements 238A-238C by conductive bumps 250A-250C. For example, conductive bump 244A may electrically connect IC 248 to conductive control element 240A, which may be electrically connected to a control terminal of a high-side transistor in semiconductor die 234. In some examples, "conductive control element" may refer to conductive control element 240A and/or conductive bumps 244A.

Conductive bumps 244A-244C, 246A-246C, 244D, 246D may include solder bumps, metal pillars, such as copper pillars, or any other suitable conductive material. In some examples, conductive bumps 244A-244C, 246A-246C, 244D, 246D may have a diameter of approximately sixty-five or one hundred micrometers. The cost of implementing conductive bumps 244A-244C, 246A-246C, 244D, 246D may be comparable to the cost of implementing wire-bonding technology for electrically connecting semiconductor die 234, 236 and IC 248.

Figure 10:
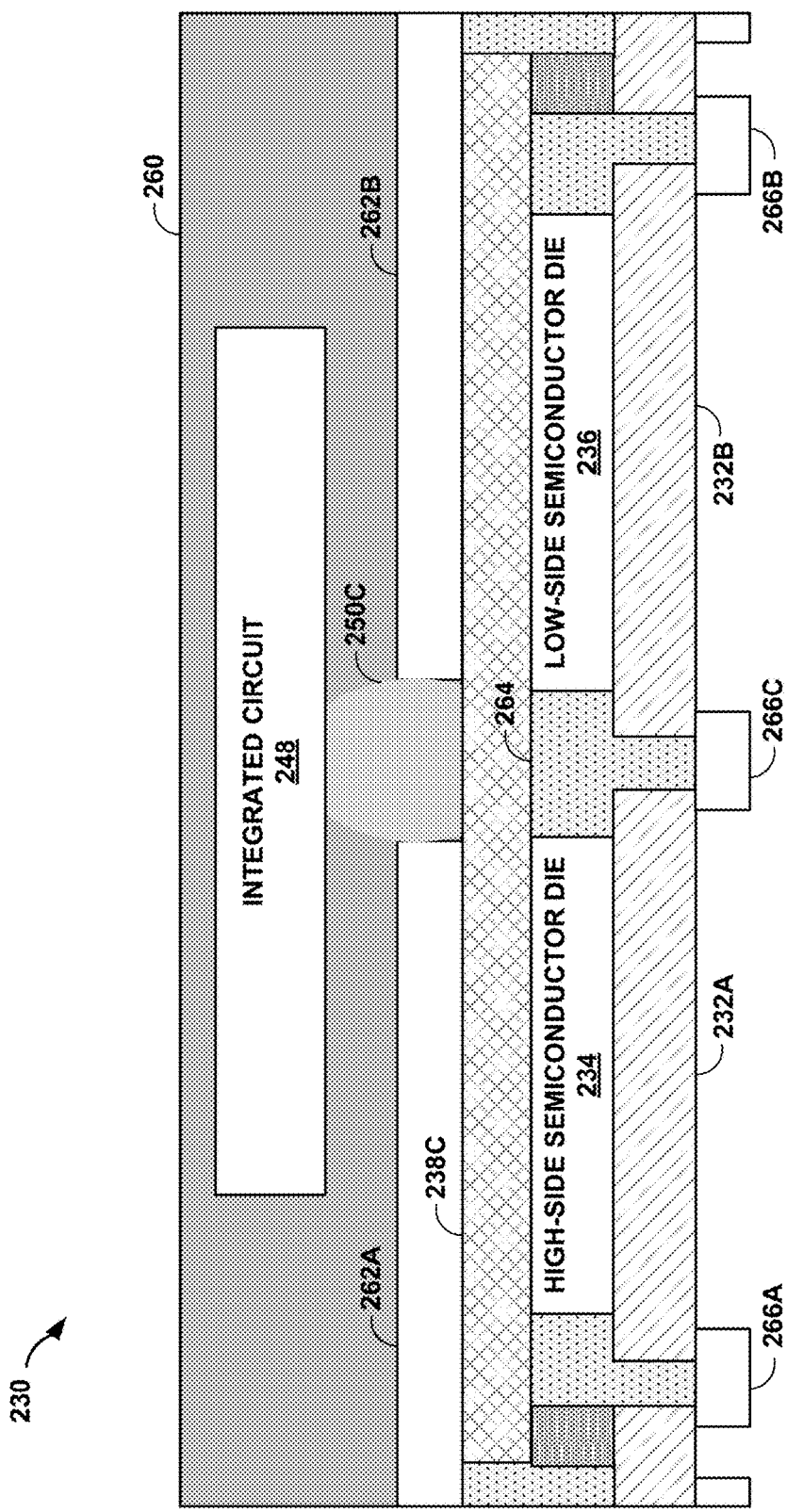
FIG. 10 is a side-view diagram of the three-phase device of FIG. 9 including an IC with flip-chip technology, in accordance with some examples of this disclosure.

FIG. 10 is a side-view diagram of the three-phase device 230 of FIG. 9 including an IC 248 connected by flip-chip technology, in accordance with some examples of this disclosure. FIG. 10 may depict device 230 at cross section C-C' of FIG. 9. IC 248 may be electrically connected to conductive output element 238C by conductive bump 250C. Conductive bump 250C may be an optional component in device 230 to allow IC 248 to electrically connect to conductive output element 238C. Conductive bump 250C may pass through or around insulating elements 262A, 262B.

During the manufacturing process, IC 248 may be soldered to conductive output element 238C by positioning conductive bump 250C between IC 248 and conductive output element 238C. The temperature of conductive bump 250C may be increased until the material in conductive bump 250C melts. The material in conductive bump 250C may be melted outside of device 230 and filled or injected into the gap between IC 248 and conductive output element 238C. When the temperature of conductive bump 250C decreases, conductive bump 250C may adhere to and electrically connect IC 248 and conductive output element 238C.

IC 248 may be fully encapsulated in molding compound 260, or IC 248 may be partially encapsulated to allow for thermal dissipation and electrical connections to external components or power sources. Semiconductor die 234, 236 may be encapsulated in molding compound 264 to electrically isolate semiconductor die 234, 236 from components that are external to device 230.

Figure 11:
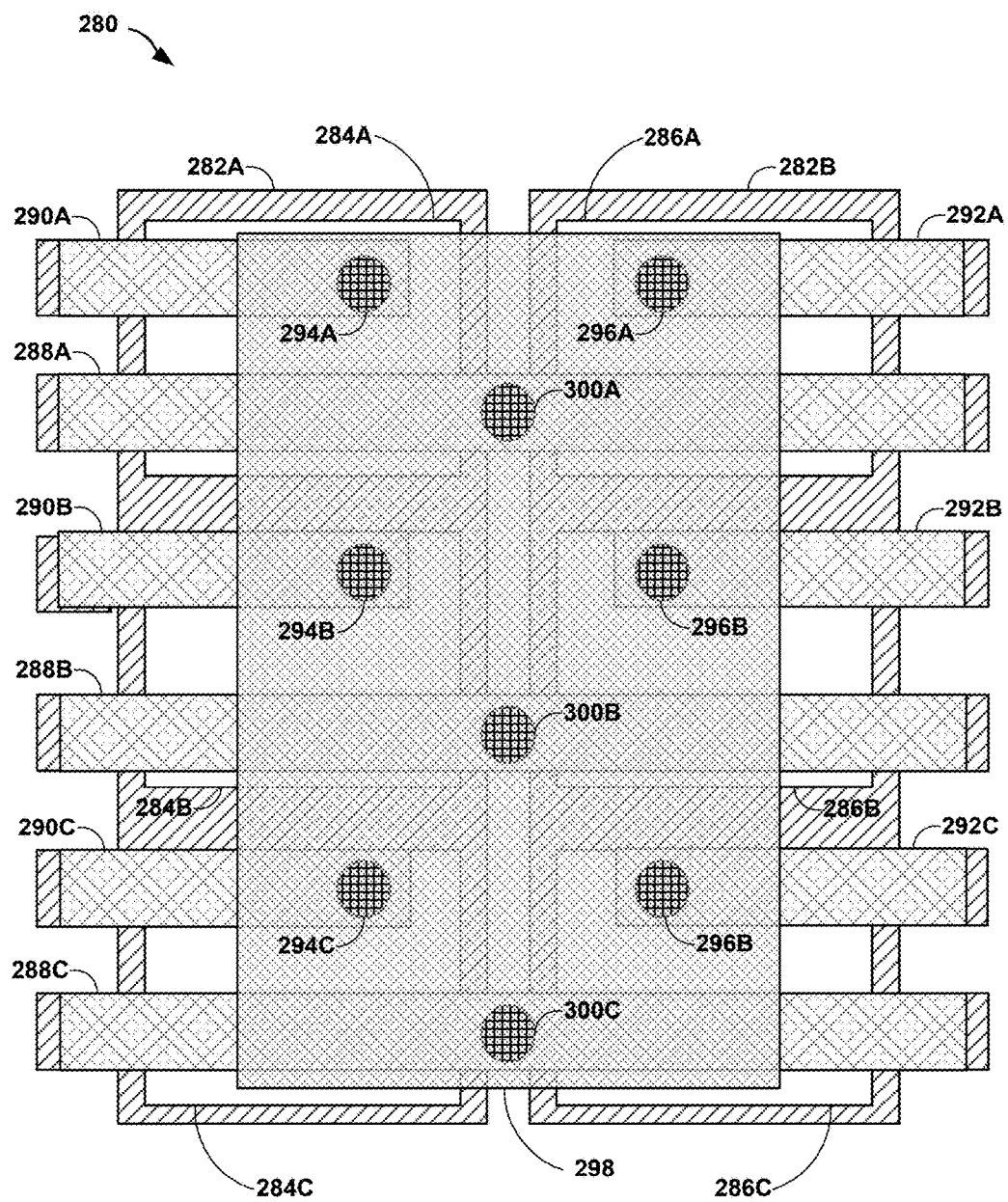
FIG. 11 is a top-view diagram of a three-phase device including discrete transistors and an IC with flip-chip technology, in accordance with some examples of this disclosure.

FIG. 11 is a top-view diagram of a three-phase device 280 including discrete transistors 284A-284C, 286A-286C and an IC 298 connected by flip-chip technology, in accordance with some examples of this disclosure. Each of transistors 284A-284C, 286A-286C may be separate from other transistors of transistors 284A-284C, 286A-286C, i.e., not integrated with other transistors into a single semiconductor die. In some examples, each of transistors 284A-284C, 286A-286C may include a separate semiconductor die. Discrete transistors 284A-284C, 286A-286C may offer benefits as described with respect to FIG. 5.

Figure 12:
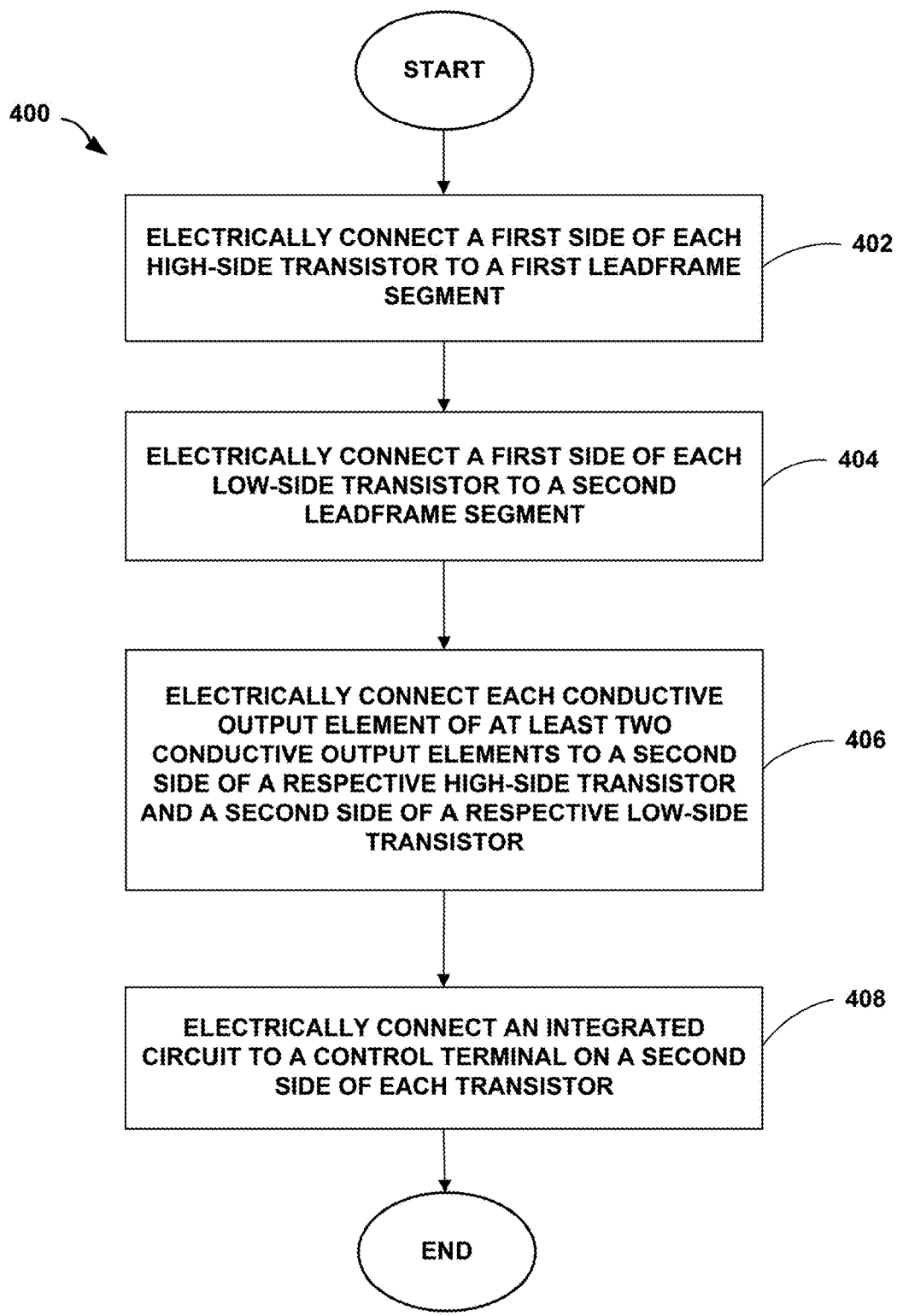
FIG. 12 is a flowchart illustrating an example technique for constructing a multiphase power converter including an IC, in accordance with some examples of this disclosure.

FIG. 12 is a flowchart illustrating an example technique 400 for constructing a multiphase power converter including an IC, in accordance with some examples of this disclosure. Technique 400 is described with reference to device 280 in FIG. 11, although other components, such as devices 2, 30, 80, 120, 150, 200, 230 in FIGS. 1-10, may exemplify similar techniques.

The technique of FIG. 12 includes electrically connecting a first side of each high-side transistor of at least two high-side transistors 284A-284C of at least four transistors 284A-284C, 286A-286C to a first leadframe segment 282A (402). High-side transistors 284A-284C may be soldered or diffusion bonded to leadframe segment 282A. In some examples, leadframe segment 282A may be electrically connected to a source for an input voltage, such as a high-side voltage rail for a multiphase half-bridge circuit.

The technique of FIG. 12 also includes electrically connecting a first side of each low-side transistor of at least two low-side transistors 286A-286C of the at least four transistors 284A-284C, 286A-286C to a second leadframe segment 282B, wherein the first leadframe segment 282A is electrically isolated from the second leadframe segment 282B (404). Low-side transistors 286A-286C may be soldered or diffusion bonded to leadframe segment 282B. In some examples, leadframe segment 282B may be electrically connected to a source for a reference voltage, such as a low-side voltage rail for a multiphase half-bridge circuit.

The technique of FIG. 12 also includes electrically connecting each conductive output element of at least two conductive output elements 288A-288C to a second side of a respective high-side transistor of the at least two high-side transistors 284A-284C and a second side of a respective low-side transistor of the at least two low-side transistors 284A-284C (406). Conductive output elements 288A-288C may be soldered or diffusion bonded to transistors 284A-284C, 286A-286C. Conductive output elements 288A-288C may be electrically connected to external components, such as the field windings of an electric motor, through switch leadframe segments. Each phase of a multiphase motor may be electrically connected to one of conductive output elements 288A-288C.

The technique of FIG. 12 also includes electrically connecting an integrated circuit (IC) 298 to a control terminal on a second side of each transistor of the at least four transistors 284A-284C, 286A-286C (408). IC 298 may deliver control signals to the control terminals of transistors 284A-284C, 286A-286C through conductive bumps 294A-294C, 296A-296C and conductive control elements 290A-290C, 292A-292C. IC 298 may be partially or fully encapsulated in molding compound to electrically isolate IC 298 and possibly allow thermal dissipation.

Figure 13:
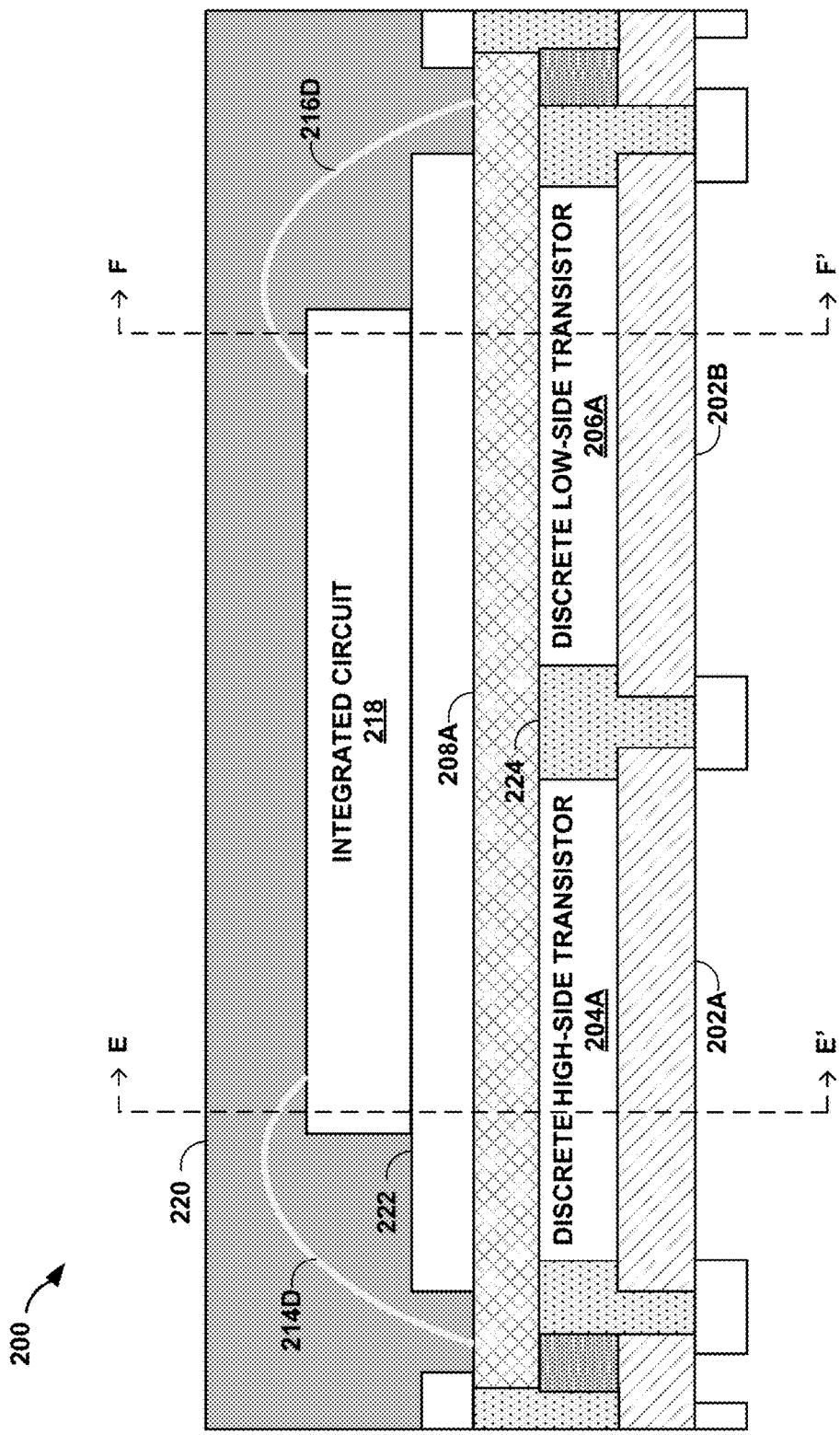
FIGS. 13-15 are side-view diagrams of the three-phase device of FIG. 8 including an IC with wire-bonding technology, in accordance with some examples of this disclosure.
Figure 14:
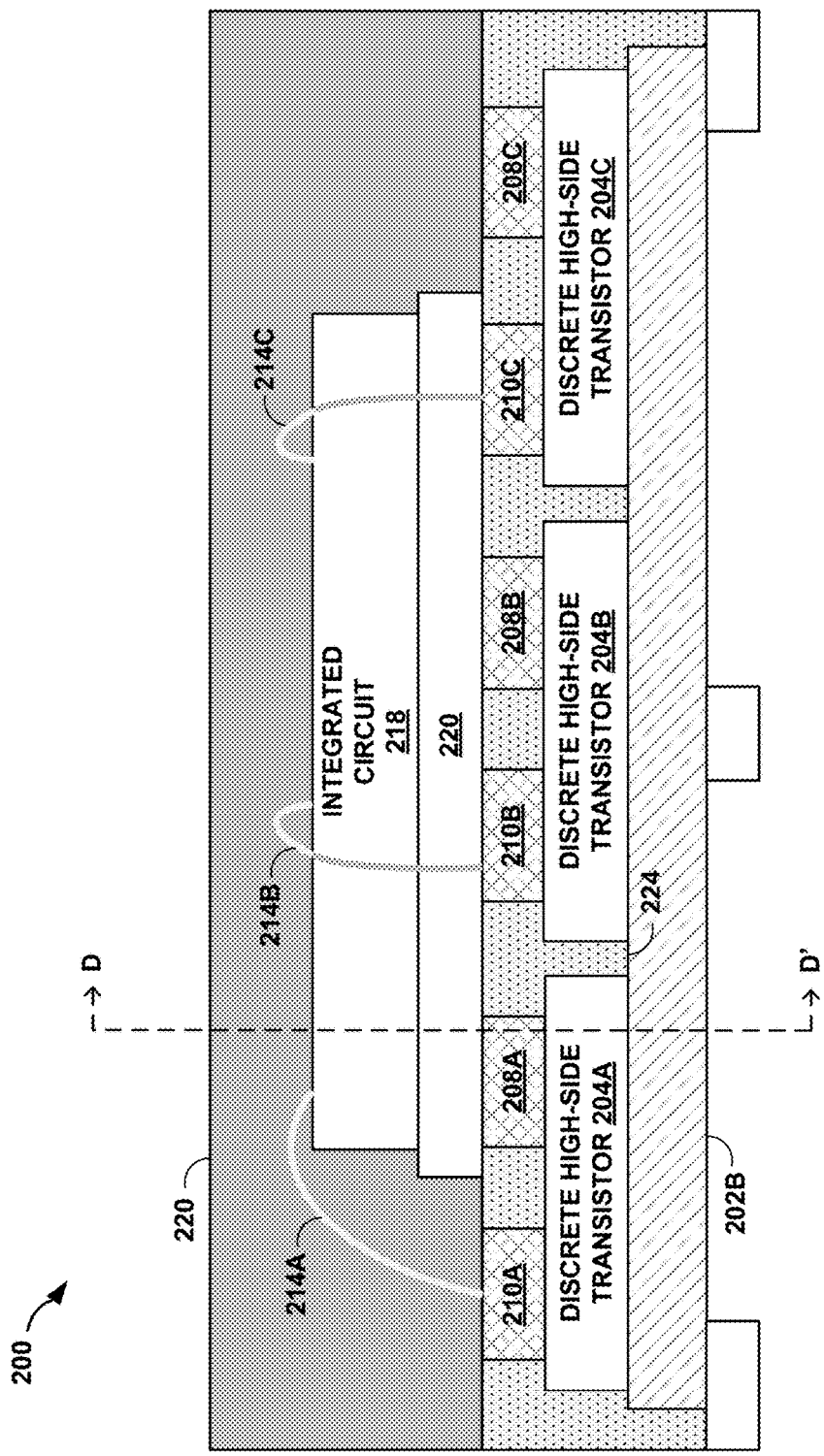
Figure 15:
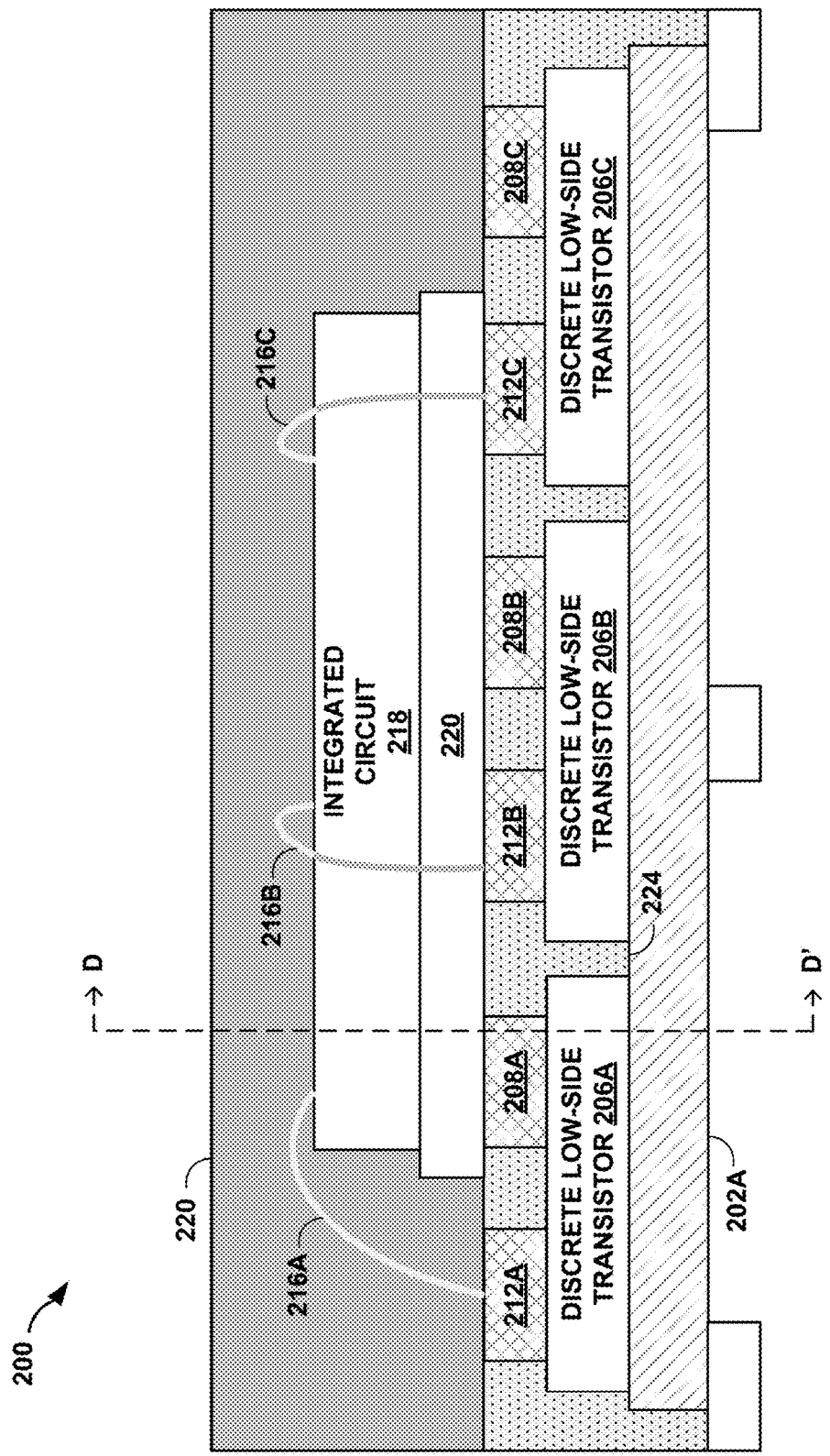

FIGS. 13-15 are side-view diagrams of the three-phase device 200 of FIG. 8 including an IC 218 connected by wire-bonding technology, in accordance with some examples of this disclosure. FIG. 13 may depict device 200 at cross section D-D' of FIGS. 8, 14, and 15. FIG. 14 depicts device 200 at cross section E-E' of FIGS. 8 and 13. FIG. 15 depicts device 200 at cross section F-F' of FIGS. 8 and 13. IC 218 may be electrically connected to the control terminals of the transistors in discrete transistors 204A-204C and 206A-206C by wire bonds 214A-214C and 216A-216C. IC 218 may be electrically connected to conductive output element 208A by wire bonds 214D, 216D. Wire bonds 214D, 216D may be an optional component in device 200 to allow IC 218 to electrically connect to conductive output element 208A. Wire bonds 214D, 216D may pass through or around insulating element 222.

Device 200 may comprise a leadless device, such as a PQFN package, so that leadframe segments 202A, 202B may be mounted on a PCB. Leadframe segments 202A, 202B may be adhered to and electrically connected to the PCB by soldering or any other suitable method. IC 218 may be fully encapsulated in molding compound 220, or IC 218 may be partially encapsulated to allow for thermal dissipation and electrical connections to external components or power sources. Discrete transistors 204A, 206A may be encapsulated in molding compound 224 to electrically isolate discrete transistors 204A, 206A from components that are external to device 200.

The following numbered examples demonstrate one or more aspects of the disclosure.

Example 1

A device includes a first leadframe segment and a second leadframe segment, wherein the second leadframe segment is electrically isolated from the first leadframe segment. The device further includes at least four transistors comprising at least two high-side transistors electrically connected to the first leadframe segment and at least two low-side transistors electrically connected to the second leadframe segment. The device further includes at least two conductive output elements, wherein each conductive output element of the at least two conductive output elements is electrically connected to a respective high-side transistor of the at least two high-side transistors and a respective low-side transistor of the at least two low-side transistors. The device further includes an IC electrically connected to a control terminal of each transistor of the at least four transistors.

Example 2

The device of example 1, wherein the first leadframe segment and the second leadframe segment are positioned on a first side of the at least four transistors, and the at least two conductive output elements and the IC are positioned on a second side of the at least four transistors.

Example 3

The device of any of examples 1-2 or combinations thereof, further comprising a molding compound encapsulating the at least four transistors and at least partially encapsulating the IC.

Example 4

The device of any of examples 1-3 or combinations thereof, further comprising at least four wire bonds, wherein the IC is electrically connected to the control terminal of each transistor of the at least four transistors by a respective wire bond of the at least four wire bonds.

Example 5

The device of any of examples 1-4 or combinations thereof, further comprising at least four solder bumps, wherein the IC is electrically connected to the control terminal of each transistor of the at least four transistors by a respective solder bump of the at least four solder bumps.

Example 6

The device of any of examples 1-5 or combinations thereof, further comprising at least four copper pillars, wherein the IC is electrically connected to the control terminal of each transistor of the at least four transistors by a respective copper pillar of the at least four copper pillars.

Example 7

The device of any of examples 1-6 or combinations thereof, further comprising a multiphase motor driver including the first leadframe segment, the second leadframe segment, the at least four transistors, the at least two conductive output elements, and the IC, wherein each transistor of the at least four transistors comprises a vertical power transistor.

Example 8

The device of any of examples 1-7 or combinations thereof, wherein each conductive output element of the at least two conductive output elements comprises a metal layer, and each conductive output element of the at least two conductive output elements is electrically isolated from all other conductive output elements of the at least two conductive output elements.

Example 9

The device of any of examples 1-8 or combinations thereof, further comprising at least four conductive control elements, wherein each conductive control element of the at least four conductive control elements is electrically connected to a control terminal of each respective transistor of the at least four transistors, wherein the IC is electrically connected to each conductive control element of the at least four conductive control elements, and wherein each conductive control element of the at least four conductive control elements comprises a metal layer.

Example 10

A method for constructing a power electronics device package, the method including electrically connecting a first side of each high-side transistor of at least two high-side transistors of at least four transistors to a first leadframe segment. The method further includes electrically connecting a first side of each low-side transistor of at least two low-side transistors of the at least four transistors to a second leadframe segment, wherein the first leadframe segment is electrically isolated from the second leadframe segment. The method further includes electrically connecting each conductive output element of at least two conductive output elements to a second side of a respective high-side transistor of the at least two high-side transistors and a second side of a respective low-side transistor of the at least two low-side transistors. The method further includes electrically connecting an integrated circuit (IC) to a control terminal on a second side of each transistor of the at least four transistors.

Example 11

The method of example 10, further comprising encapsulating the at least four transistors in a molding compound and at least partially encapsulating the IC in the molding compound.

Example 12

The method of any of examples 10-11 or combinations thereof, wherein electrically connecting the IC to the control terminal of each high-side transistor comprises electrically connecting a wire bond of at least four wire bonds to a control terminal of each respective transistor of the at least four transistors. Electrically connecting the IC to the control terminal of each high-side transistor further comprises electrically connecting the at least four wire bonds to the IC.

Example 13

The method of any of examples 10-12 or combinations thereof, wherein electrically connecting the IC to the control terminal of each high-side transistor comprises soldering at least four solder bumps to the IC. Electrically connecting the IC to the control terminal of each high-side transistor further comprises electrically connecting each solder bump of the at least four solder bumps to a control terminal of each respective transistor of the at least four transistors.

Example 14

The method of any of examples 10-13 or combinations thereof, wherein electrically connecting the IC to the control terminal of each high-side transistor comprises electrically connecting each copper pillar of at least four copper pillars to a control terminal of each respective transistor of the at least four transistors. Electrically connecting the IC to the control terminal of each high-side transistor further comprises electrically connecting the at least four copper pillars to the IC.

Example 15

The method of any of examples 10-14 or combinations thereof, wherein each transistor of the at least four transistors comprises a vertical power transistor.

Example 16

The method of any combination of examples 10-15, wherein each conductive output element of the at least two conductive output elements comprises a metal layer.

Example 17

The method of any of examples 10-16 or combinations thereof, further comprising electrically connecting each conductive control element of at least four conductive control elements to a control terminal of each respective transistor of the at least four transistors, wherein each conductive control element of the at least four conductive control elements comprises a metal layer. Electrically connecting the IC to a control terminal on the second side of each transistor of the at least four transistors comprises electrically connecting the IC to the at least four conductive control elements.

Example 18

A multi-phase power device includes a first leadframe segment and a second leadframe segment, wherein the second leadframe segment is electrically isolated from the first leadframe segment. The multi-phase power device further includes at least four vertical transistors comprising at least two high-side vertical transistors electrically connected to the first leadframe segment and at least two low-side vertical transistors electrically connected to the second leadframe segment, wherein the first leadframe segment and the second leadframe segment are electrically connected to a first side of the at least four vertical transistors. The multi-phase power device further includes at least two conductive output elements, wherein each conductive output element of the at least two conductive output elements is electrically connected to a second side of a respective high-side vertical transistor of the at least two high-side vertical transistors and a second side of a respective low-side vertical transistor of the at least two low-side vertical transistors. The multi-phase power device further includes at least four conductive control elements, wherein each conductive control element of the at least four conductive control elements is electrically connected to a control terminal on the second side of each respective transistor of the at least four transistors. The multi-phase power device further includes an integrated circuit (IC) electrically connected, by a respective conductive control element of the at least four conductive control elements, to each respective conductive control terminal of the at least four conductive control terminals.

Example 19

The multi-phase power device of example 18, further comprising a molding compound encapsulating the at least four transistors and at least partially encapsulating the IC, wherein the at least four conductive control elements comprise at least four solder bumps.

Example 20

The multi-phase power device of any of examples 18-19 or combinations thereof, further comprising a molding compound encapsulating the at least four transistors and at least partially encapsulating the IC, wherein the at least four conductive control elements comprise at least four copper pillars.

Example 21

The multi-phase power device of any of examples 18-20 or combinations thereof, further comprising a molding compound encapsulating the at least four transistors and at least partially encapsulating the IC, wherein the at least four conductive control elements comprise at least four wire bonds.

Various examples of the disclosure have been described. Any combination of the described systems, operations, or functions is contemplated. These and other examples are within the scope of the following claims.

What is claimed is:

1. A device comprising:
   at least four transistors comprising at least two high-side transistors and at least two low-side transistors;
   a first leadframe segment positioned on a first side of the at least two high-side transistors and electrically connected to the at least two high-side transistors;
   a second leadframe segment positioned on a first side of the at least two low-side transistors and electrically connected to the at least two low-side transistors, wherein the first side of the at least two high-side transistors and the first side of the at least two low-side transistors are a same side, and wherein the second leadframe segment is electrically isolated from the first leadframe segment;
   at least two conductive output elements, wherein each conductive output element of the at least two conductive output elements is positioned on a second side of a respective high-side transistor of the at least two high-side transistors and positioned on a second side of a respective low-side transistor of the at least two low-side transistors, wherein the second side of each respective high-side transistor of the at least two high-side transistors and the second side of each respective low-side transistor of the at least two low-side transistors are a same side, and wherein each conductive output element of the at least two conductive output elements is electrically connected to a respective high-side transistor of the at least two high-side transistors and a respective low-side transistor of the at least two low-side transistors; and
   an integrated circuit (IC) electrically connected to a control terminal of each transistor of the at least four transistors.

2. The device of claim 1, further comprising a molding compound encapsulating the at least four transistors and at least partially encapsulating the IC.

3. The device of claim 1, further comprising at least four wire bonds, wherein the IC is electrically connected to the control terminal of each transistor of the at least four transistors by a respective wire bond of the at least four wire bonds.

4. The device of claim 1, further comprising at least four solder bumps, wherein the IC is electrically connected to the control terminal of each transistor of the at least four transistors by a respective solder bump of the at least four solder bumps.

5. The device of claim 1, further comprising at least four copper pillars, wherein the IC is electrically connected to the control terminal of each transistor of the at least four transistors by a respective copper pillar of the at least four copper pillars.

6. The device of claim 1, further comprising a multiphase motor driver including the first leadframe segment, the second leadframe segment, the at least four transistors, the at least two conductive output elements, and the IC, wherein each transistor of the at least four transistors comprises a vertical power transistor.

7. The device of claim 1, wherein:
   each conductive output element of the at least two conductive output elements comprises a metal layer; and
   each conductive output element of the at least two conductive output elements is electrically isolated from all other conductive output elements of the at least two conductive output elements.

8. The device of claim 1, further comprising at least four conductive control elements, wherein:
   each conductive control element of the at least four conductive control elements is electrically connected to a control terminal of each respective transistor of the at least four transistors;
   the IC is electrically connected to each conductive control element of the at least four conductive control elements; and
   each conductive control element of the at least four conductive control elements comprises a metal layer.

9. A method for constructing a power electronics device package, the method comprising:
   electrically connecting a first side of each high-side transistor of at least two high-side transistors of at least four transistors to a first leadframe segment;
   electrically connecting a first side of each low-side transistor of at least two low-side transistors of the at least four transistors to a second leadframe segment, wherein the first side of the at least two high-side transistors and the first side of the at least two low-side transistors are a same side, and wherein the first leadframe segment is electrically isolated from the second leadframe segment;
   electrically connecting each conductive output element of at least two conductive output elements to a second side of a respective high-side transistor of the at least two high-side transistors and a second side of a respective low-side transistor of the at least two low-side transistors, wherein the second side of each respective high-side transistor of the at least two high-side transistors and the second side of each respective low-side transistor of the at least two low-side transistors are a same side; and electrically connecting an integrated circuit (IC) to a control terminal on a second side of each transistor of the at least four transistors.

10. The method of claim 9, further comprising:
encapsulating the at least four transistors in a molding compound; and
at least partially encapsulating the IC in the molding compound.

11. The method of claim 9, wherein electrically connecting the IC to the control terminal of each high-side transistor comprises:
electrically connecting a wire bond of at least four wire bonds to a control terminal of each respective transistor of the at least four transistors; and
electrically connecting the at least four wire bonds to the IC.

12. The method of claim 9, wherein electrically connecting the IC to the control terminal of each high-side transistor comprises:
soldering at least four solder bumps to the IC; and
electrically connecting each solder bump of the at least four solder bumps to a control terminal of each respective transistor of the at least four transistors.

13. The method of claim 9, wherein electrically connecting the IC to the control terminal of each high-side transistor comprises:
electrically connecting each copper pillar of at least four copper pillars to a control terminal of each respective transistor of the at least four transistors; and
electrically connecting the at least four copper pillars to the IC.

14. The method of claim 9, wherein each transistor of the at least four transistors comprises a vertical power transistor.

15. The method of claim 9, wherein each conductive output element of the at least two conductive output elements comprises a metal layer.

16. The method of claim 9, further comprising electrically connecting each conductive control element of at least four conductive control elements to a control terminal of each respective transistor of the at least four transistors, wherein:
each conductive control element of the at least four conductive control elements comprises a metal layer, and
electrically connecting the IC to a control terminal on the second side of each transistor of the at least four transistors comprises electrically connecting the IC to the at least four conductive control elements.

17. A multi-phase power device comprising:
a first leadframe segment;
a second leadframe segment, wherein the second leadframe segment is electrically isolated from the first leadframe segment;
at least four vertical transistors comprising at least two high-side vertical transistors electrically connected to the first leadframe segment and at least two low-side vertical transistors electrically connected to the second leadframe segment, wherein the first leadframe segment and the second leadframe segment are electrically connected to a first side of the at least four vertical transistors;
at least two conductive output elements, wherein each conductive output element of the at least two conductive output elements is electrically connected to a second side of a respective high-side vertical transistor of the at least two high-side vertical transistors and a second side of a respective low-side vertical transistor of the at least two low-side vertical transistors, wherein the second side of each high-side transistor of the at least two high-side transistors and the second side of each low-side transistor of the at least two low-side transistors are a same side;
at least four conductive control elements, wherein each conductive control element of the at least four conductive control elements is electrically connected to a control terminal on the second side of each respective transistor of the at least four transistors; and
an integrated circuit (IC) electrically connected, by a respective conductive control element of the at least four conductive control elements, to each respective control terminal of the at least four transistors.

18. The multi-phase power device of claim 17, further comprising a molding compound encapsulating the at least four transistors and at least partially encapsulating the IC, wherein the at least four conductive control elements comprise at least four solder bumps.

19. The multi-phase power device of claim 17, further comprising a molding compound encapsulating the at least four transistors and at least partially encapsulating the IC, wherein the at least four conductive control elements comprise at least four wire bonds.

20. The device of claim 1,
wherein a control terminal of each transistor of the at least four transistors is positioned on the second side of the at least four transistors, and
wherein the IC is positioned on the second side of the at least four transistors.

* * * * *